United States Patent [19]
Klein et al.

[11] Patent Number: 5,867,366
[45] Date of Patent: Feb. 2, 1999

[54] ELECTRONIC MODULE AND PLASTIC SUBSTRATE TO ACCEPT AND HOLD THE ELECTRONIC MODULE

[75] Inventors: Klaus Klein, Rheinstetten; Franz Mittnacht, Karlsruhe, both of Germany; Edgar Starck, Haguenau, France

[73] Assignee: Siemens Aktiengesellschaft, München, Germany

[21] Appl. No.: 454,164

[22] PCT Filed: Dec. 8, 1993

[86] PCT No.: PCT/DE93/01173

§ 371 Date: Aug. 14, 1995

§ 102(e) Date: Aug. 14, 1995

[87] PCT Pub. No.: WO94/14306

PCT Pub. Date: Jun. 23, 1994

[30]    Foreign Application Priority Data

Dec. 17, 1992 [DE] Germany ................. G 92 17 265.2
Dec. 17, 1992 [DE] Germany ................. G 92 17 302.0

[51] Int. Cl.⁶ .................................................. H05K 7/14
[52] U.S. Cl. ................ 361/737; 361/736; 361/679; 361/741; 361/748; 361/752; 439/44; 439/95; 439/542; 439/282; 439/946; 174/52.1; 174/52.2; 174/52.4
[58] Field of Search ....................... 361/736, 679, 361/726, 740, 747, 737, 752, 759, 684, 686, 799, 800, 748, 796, 802, 741, 756; 174/52.1, 52.2, 52.3; 439/76.1, 44, 608, 946, 95, 542, 282

[56]             References Cited

U.S. PATENT DOCUMENTS 5,330,360   7/1994   Marsh et al. ..................... 439/76
5,483,422   1/1996   Bowen et al. ................... 361/737
5,548,483   8/1996   Feldman .......................... 361/737
5,600,539   2/1997   Heys, Jr. et al. ............... 361/686

FOREIGN PATENT DOCUMENTS 64-57540   4/1989   Japan .

OTHER PUBLICATIONS

Patent Abstracts of Japan, vol. 8, No. 55, P–260, JP–A–58–203687 (Canon K.K.), 24 May 1982.
Patent Abstracts of Japan, vol. 13, No. 135, P–851, JP–A–63–302490 (Mitsubishi Electric Corp.), 2 Jun. 1987.
Patent Abstracts of Japan, vol. 8, No. 55, P–260, JP–A–58–203686 (Canon K.K.), 21 May 1982.
IBM Technical Disclosure Bulletin, vol. 23, No. 5, Oct. 1980, M.I. Davis: *Solid–State Cartridge System*, pp. 1748–1750.
Datamation, Apr. 15, 1992, pp. 55–57: *Tiny PC Cards Pack A Punch*, Scott D. Palmer.

*Primary Examiner*—Leo P. Picard
*Assistant Examiner*—David Foster
*Attorney, Agent, or Firm*—Kenyon & Kenyon

[57]                ABSTRACT

The present invention relates to an electronic module, especially a storage module, having a strip on each of two opposite sides and a plastic substrate to accept and hold the electronic module in grooves in two U-shaped rails corresponding to the strips. The electronic module also has a plastic frame which accepts a fitted printed-circuit board and has at least one electrically conductive covering on either its upper and/or lower side and which extends as far as the strips and is connected to a reference potential. The electrical connection of the coverings to reference potential is ensured by contact components.

14 Claims, 2 Drawing Sheets

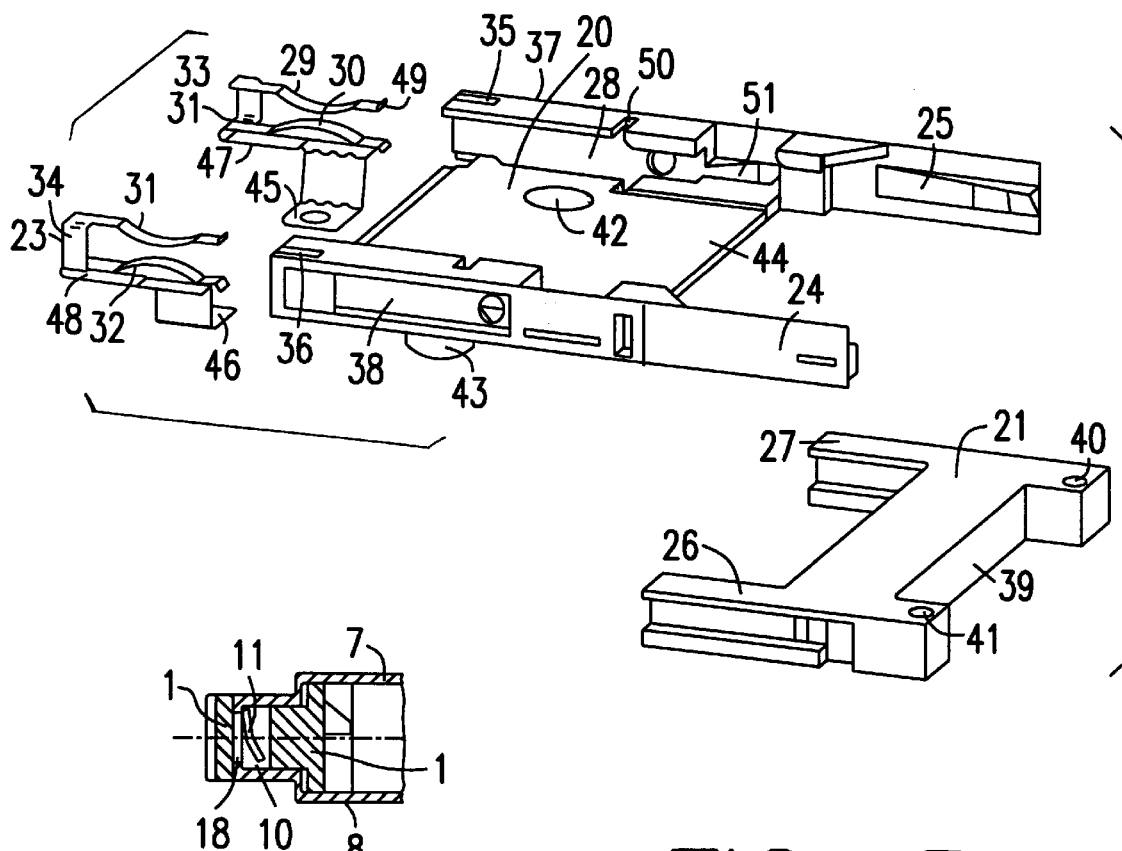

ELECTRONIC MODULE AND PLASTIC SUBSTRATE TO ACCEPT AND HOLD THE ELECTRONIC MODULE

BACKGROUND OF THE INVENTION

The present invention relates to an electronic module, especially a storage module, having a strip on each of two opposite sides and a plastic substrate to accept and hold the electronic module in grooves corresponding to the strips in the module substrate on a printed-circuit board.

By means of the electronic modules, which are accepted in a module substrate on a printed-circuit board, system components, like for example central controller modules or communications processors of programmable controllers, are realizable with a variable memory capacity. Depending on the requirement of the automation task, they can be provided with a memory of variable size. At the same time, the electronic module and the plastic substrate to accept the module on the printed-circuit board must meet the demands of industrial capability.

SUMMARY OF THE INVENTION

The present invention provides an electronic module, especially a storage module, and a plastic substrate to accept the electronic module on a printed-circuit board which, using simple means, assures good electromagnetic compatibility and avoids potential displacements between the electronic module and its surroundings.

The plastic substrate can have two U-shaped rails. A strip is located on each of two opposite sides of the electronic module to accept and hold the module in grooves in the two U-shaped rails. A plastic frame is provided which accepts a fitted printed-circuit board and an electrically conductive covering, which is disposed on either an upper or lower side of the substrate which extends as far as the strips. The rails can be two-part elements such that a first rail section is secured in a second end rail section which has a connector for the electronic module by means of a releasable latch connection.

A covering can be placed on the upper and lower sides of the plastic frame. These coverings can be identical. The plastic frame has first openings in a peripheral area of the frame and the coverings have tabs extending through these openings which are bent at a right angle. The tabs extend through the openings and produce an electrical connection between the coverings. The plastic frame has second openings along the peripheral area of the frame, which are designed in such a way that they form a latch connection with hooks of the coverings. This latch connection can be permanent.

An electrically conductive flat spring, which can be galvanically tin-plated, is arranged inside on one limb of at least one U-shaped rail of the plastic substrate for contacting the covering of the module in the area of the strips. This flat spring is provided with at least one lug for the electrical connection to a reference potential. The flat spring is positioned against the covering, runs essentially parallel to the rail, rests with its both ends on the inner side of the limb, and has a curvature in the middle area. In a further embodiment, two flat springs are arranged opposite one another on the inner sides of the limbs of a U-shaped rail. These springs are joined to one another at at least one end by a part overlapping the yoke of the groove in the U-shaped rail.

A lug is designed as an extension prolongation on the end of a flat spring. This extension prolongation is led back, bent by 180°, on the outer side of the limb and is provided with a tab which covers a base plate of the plastic substrate in the area of a bore hole for fastening to a further printed-circuit board. The flat spring can be arranged in front in the area of the beginning of the rail and a lug is led to the front for the electrical connection to a front plate. A lug can be led upward to the side opposite a further printed-circuit board for the electrical connection to an adjacent printed-circuit board.

A part which joins the two flat springs is supported in a slot-shaped recess in a yoke of the rail and the two flat springs have projections on their opposite ends which extend into corresponding recesses in the limbs.

A reliable contacting of the upper as well as the lower covering of the electronic module is achieved by means of providing two flat springs, opposite one another, for the plastic substrate. For the flat springs to reliably contact a reference potential, a lug can be provided with a tab which is squeezed by the contact pressure of the fastening elements of the plastic substrate against reference-potential-carrying lines on the printed-circuit board. The arrangement of the flat springs at the front, in the area of the beginning of the rail, causes the connection to the reference potential to be established upon insertion of the electronic module before the connectors come in contact. By this means, destruction of sensitive components while assembly is avoided. A relatively short lug that leads to the front is sufficient to produce an electrical connection to a front plate. By means of an additional lug that leads upward to an adjacent printed-circuit board, a reference potential connection can be produced between two adjacent printed-circuit boards via the flat springs in the plastic substrate. Flat springs can easily be inserted in the plastic substrate and are permanently mounted therein when an upper part which joins the two flat springs is supported in a slot-shaped recess in the plastic substrate in a yoke of the rail and when the flat springs have projections on their opposite ends which extend into corresponding recesses in the limbs. The flat springs, including joining part and lugs, are able to be produced as a one-piece component by punching and bending from flat material. To assure lasting good contact, it is advantageous to galvanically tin-plate the component. When using a two-part plastic substrate, a part which covers components located under it on the printed-circuit board is easily detachable for troubleshooting or repair, even when the connector is already soldered to the printed-circuit board.

With the electronic module according to the present invention and the plastic substrate it is possible to easily adhere to the demands for industrial capability. A central processing unit of a programmable controller equipped therewith is able to be expanded by the exchange of modules and can be adapted in a simple manner to an objective set in each case.

BRIEF DESCRIPTION OF THE DRAWINGS

The present invention, as well as refinements and advantages, are more precisely explained in the following with the aid of drawings in which an exemplary embodiment of the invention is represented.

FIG. 2 illustrates a sectional view of a contact point.

FIG. 3 illustrates a section view of a latch connection.

FIG. 4 illustrates an exploded view of a plastic substrate according to the present invention.

FIG. 5 illustrates flat springs with a lug to the front.

FIG. 6 illustrates flat springs with a lug leading upward.

DETAILED DESCRIPTION

Figure 1:
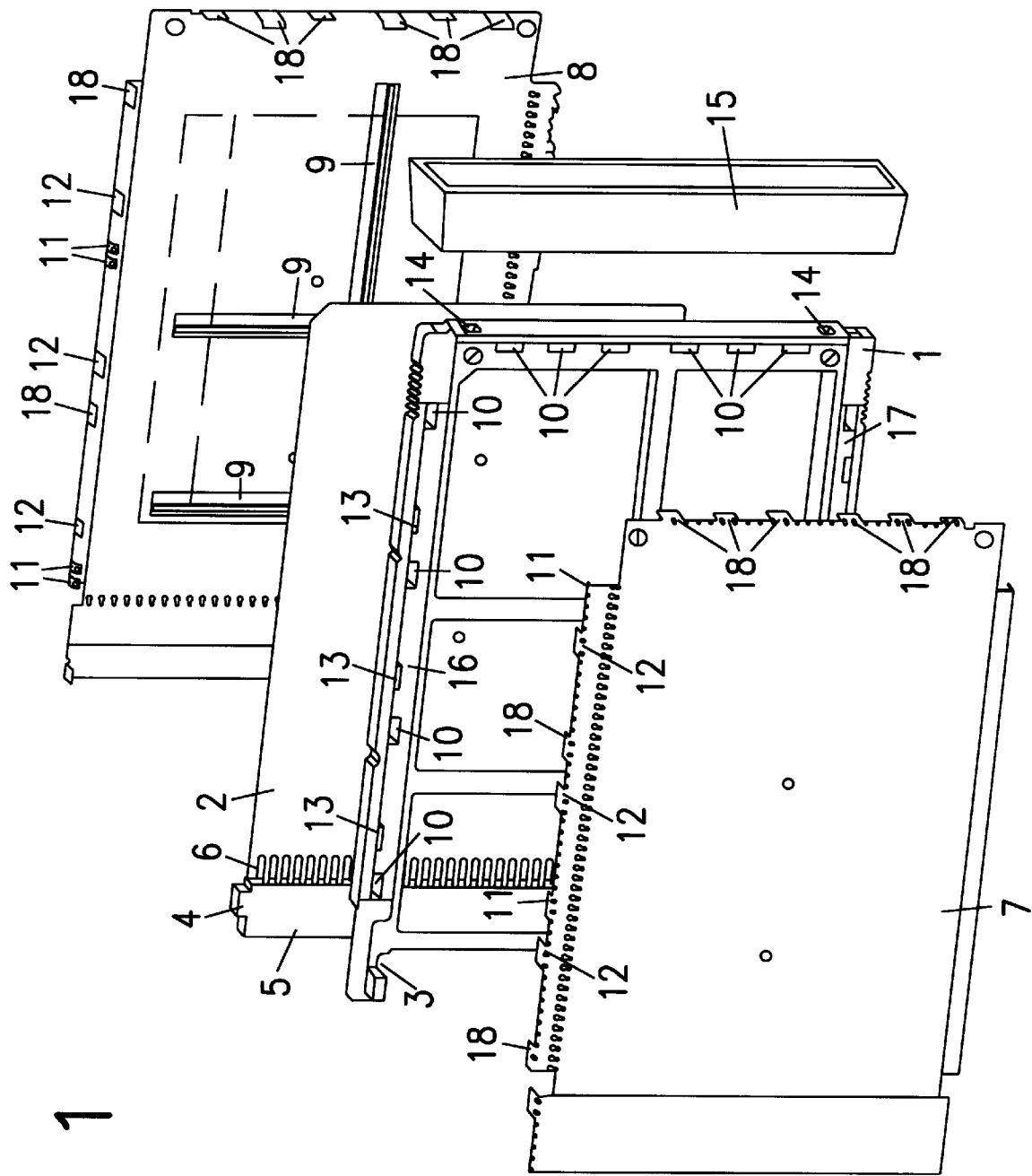
FIG. 1 illustrates an exploded view of an electronic module according to the present invention.

An electronic module according to FIG. 1 consists of a plastic frame 1 which accepts a printed-circuit board 2. The plastic frame 1 has a notch 3 into which a plug 4 of the connector 5 on the printed-circuit board 2 extends in order that the forces necessary to insert and withdraw the electronic module are applied to the plastic frame 1 and the soldered connections 6 of the connector 5 are relieved. Coverings 7 and 8 are provided to shield the electronic module from electromagnetic irradiation. To avoid short circuits, spacers 9 can be mounted between the printed-circuit board 2 and the coverings 7 or 8. Openings 10 are provided in the peripheral area of the plastic frame 1 passing through the frame between the top and bottom side. In the assembled state of the electronic module, tabs 11 and 18 extend into these openings 10, the tabs 11 and 12 producing an electrical connection between the coverings 7 and 8. Hooks 12 engage with further openings 13 and effect a latch connection therein. The plastic frame 1 is provided on the front side with notch points 14 to which a pull grip 15 can be secured. The two coverings 7 and 8 extend as far as the strips 16 and 17 of the plastic substrate 1 so that, by way of a substrate to accept and hold the electronic module, a connection can be produced to reference potential. They are identically designed and are therefore easily interchangeable.

In the sectional view according to FIG. 2, the area of a contact point is represented. Tabs 11 of the covering 7, as well as a tab 18 of the covering 8 extend into an opening 10 in the plastic frame 1. The tabs 11, which are bent inwardly during the assembly, rest firmly on the tab 18 because of their spring tension and thus produce a reliable contact between the two coverings 7 and 8.

FIG. 3 shows a latch connection in the connector area of the electronic module. A hook 12, which comes to lie in an opening 13 in the plastic frame 1, grips a projection 19 therein from behind and permanently interlocks. It is able to be produced in a simple manner as a notch in an extension elongation of the sheet metal of covering 7 which is bent at a right angle. With the aid of such a latch connection, a high torsional rigidity of the electronic module is achieved.

A plastic substrate according to FIG. 4 consists of a beginning rail section 20, an end rail section 21, as well as contact components 22 and 23. To assemble, the beginning rail section 20 is slid with its two arms 24 and 25 over the two rails 26 and 27 of the end rail section 21 so that the two sections 20 and 21 form a latch connection which can be released again by forcing apart the arms 24 and 25. Furthermore, the contact components 22 and 23 are inserted into grooves in the beginning rail section 20, of which only the groove 28 is visible in the perspective representation. The two contact components 22 and 23 which each have flat springs 29 and 30 or 31 and 32, come to lie with their respective parts 33 and 34 connecting the flat springs in slot-shaped recesses 35 and 36 in the yokes 37 and 38 of the U-shaped rails. Because of their design with a curvature in the middle area, the flat springs 29, 30, 31 and 32 are substantially safe from damage when inserting or withdrawing a module. The connector for contacting an electronic module, as well as the electronic module itself according to the present invention and the printed-circuit board on which the plastic substrate according to the present invention is fastened are not shown in FIG. 4 for the sake of clarity. The connector is arranged in the region 39 of the end rail section 21. The plastic substrate is provided with bore holes 40, 41 for mounting on the printed-circuit board, as well. Two further bore holes not visible in FIG. 4 because of their arrangement in depressions 42 and 43 in a base plate 44. In assembled state, the base plate 44 is covered in the region of the two last-named bore holes by two tabs 45 and 46. In this manner, the tabs 45 and 46 produce a reliable contact to conductors on the printed-circuit board which carry reference potential. They are each connected to the flat springs by way of lugs 47 and 48. The flat springs each have a projection 49 which engages with a recess 50 corresponding to it in a limb of a U-shaped rail. In this manner the flat springs are safeguarded against shifting in the grooves. Two check springs, of which only the one (51) is visible, serve for the shake-proof holding of the electronic module in the plastic frame. Since the top side of the plastic substrate is open, no restricting conditions whatsoever are set on the height of the electronic module.

A flat spring according to FIG. 5 is provided with a lug 52 that leads to the front which produces an electrical connection to the reference potential of an electrically conductive front plate.

According to FIG. 6, a lug 53 that leads upwardly makes possible the electrical connection between two adjacent printed-circuit boards via the contact component of the plastic substrate.

What is claim is:

1. An electronic module having a first module side and a second module side, the first module side being positioned opposite to the second module side, comprising:
   a plastic substrate having two U-shaped rails;
   a first strip positioned on the first module side;
   a second strip positioned on the second module side, the first and second module strips adapted to accept and maintain the electronic module in grooves in corresponding U-shaped rails of said plastic substrate; and
   a plastic frame adapted to accept a fitted printed-circuit board and including an electrically conductive covering disposed on at least one of an upper side of the plastic frame and a lower side of the plastic frame, the electrically conductive covering extending along an extension of the first and second strips.

2. The electronic module of claim 1, wherein the electrically conductive covering is positioned on both the upper and lower sides of the plastic frame,
   wherein the plastic frame has first openings in a peripheral area of said frame, and
   wherein the electrically conductive covering has tabs extending through the first openings, the tabs being bent at a right angle to produce an electrical connection between the electrically conductive covering and the plastic frame.

3. The electronic module of claim 1, wherein the plastic frame has second openings along the peripheral area of the plastic frame, and wherein the electrically conductive covering includes hooks to form a latch connection with the second openings.

4. The electronic module of claim 3, wherein the latch connection is permanent.

5. The electronic module of claim 2, wherein the plastic frame includes a further conductive covering similar to the electrically conductive covering.

6. The electronic module of claim 1, wherein a first rail of the two corresponding U-shaped rails includes a first limb for arranging a first electrically conductive flat spring inside on the first limb the electrically conductive covering being contacted by the first electrically conductive flat spring substantially at a position of the first and second strips, the first electrically conductive flat spring including at least one lug for electrically connecting to a reference potential.

7. The electronic module of claim 6, wherein the first electrically conductive flat spring extends substantially parallel to a corresponding rail of the two U-shaped rails and includes two spring ends and a curved middle portion, the first electrically conductive flat spring resting, via the two spring ends, on an inner side of the first limb.

8. The electronic module of claim 6, wherein a second rail of the two corresponding U-shared rails includes a second limb for arranging a second electrically conductive flat spring opposite to the first electrically conductive flat spring inside the second limb, each of the first and second electrically conductive flat springs including a spring portion for connecting the first electrically conductive flat spring to the second electrically conductive flat spring, the first and second rail including a groove with a yoke, the yoke being overlapped by the spring portion.

9. The electronic module of claim 6, wherein the at least one lug extends on one end of the first electrically conductive flat spring, the at least one lug being bent at an angle of 180° to extend outside of the first limb and including a tab for covering a base plate of the plastic substrate, the base plate including a bore hole being covered for coupling to a further printed-circuit board.

10. The electronic module of claim 6, wherein the first electrically conductive flat spring is arranged at a front portion of the rail, and wherein the at least one lug is guided to the front portion for electrically connecting to a front plate.

11. The electronic module of claim 6, wherein the at least one lug is guided upward to a side that is opposite the fitted printed-circuit board for electrically connecting to an adjacent printed-circuit board.

12. The electronic module of claim 8, wherein the spring portion is positioned in a slot-shaped recess in the yoke, and wherein the first electrically conductive flat spring includes a respective projection on an opposite respective end extending into corresponding recesses in the first and second limbs.

13. The electronic module of claim 6, wherein the first electrically conductive flat spring is galvanically tin-plated.

14. The electronic module of claim 6, wherein each of the two corresponding U-shaped rails has a two-part construction, a first rail section of the two-part construction being secured to a second rail section of the two-part construction which has a connector for connecting to the electronic module via a releasable latch connection.

* * * * *